United States Patent
Liu et al.

(10) Patent No.: US 10,783,829 B2
(45) Date of Patent: Sep. 22, 2020

(54) DISPLAY PANEL AND DISPLAY DEVICE WITH UNIFORM BRIGHTNESS

(71) Applicant: Shanghai Tianma AM-OLED Co., Ltd., Shanghai (CN)

(72) Inventors: Liyuan Liu, Shanghai (CN); Zhiyong Xiong, Shanghai (CN); Tianqing Hu, Shanghai (CN); Ping An, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 16/244,293

(22) Filed: Jan. 10, 2019

(65) Prior Publication Data
US 2019/0333450 A1 Oct. 31, 2019

(30) Foreign Application Priority Data
Apr. 26, 2018 (CN) .......................... 2018 1 0386273

(51) Int. Cl.
*G09G 3/3258* (2016.01)
*G09G 3/20* (2006.01)
*H01L 27/32* (2006.01)

(52) U.S. Cl.
CPC ......... *G09G 3/3258* (2013.01); *G09G 3/2003* (2013.01); *H01L 27/3211* (2013.01);
(Continued)

(58) Field of Classification Search
CPC ... G09G 2300/0452; G09G 2320/0233; G09G 2320/0666; G09G 3/2003; G09G 3/3258; H01L 27/3211; H01L 27/3276
See application file for complete search history.

(56) References Cited

U.S. PATENT DOCUMENTS

| 2009/0322726 A1* | 12/2009 | Takasugi | G09G 3/3233 345/211 |
| 2013/0162622 A1* | 6/2013 | Ebisuno | G09G 3/3208 345/212 |

(Continued)

FOREIGN PATENT DOCUMENTS

| CN | 203480804 U | 3/2014 |
| CN | 106449720 A | 2/2017 |

(Continued)

OTHER PUBLICATIONS

Chinese Office Action related to Application No. 201810386273.2 dated Jul. 23, 2019.

*Primary Examiner* — Chun-Nan Lin
(74) *Attorney, Agent, or Firm* — Miller, Matthias & Hull LLP (57) ABSTRACT

Provided is a display panel and display device. The display panel includes a first type sub-pixel and a second type sub-pixel. The first type sub-pixel includes a first voltage-regulating module, which is connected between a pixel drive circuit and a light-emitting component in the first type sub-pixel for increasing a voltage of two ends of the light-emitting component; and/or, the second type sub-pixel includes a second voltage-regulating module, which is connected between a pixel drive circuit and a light-emitting component in the second type sub-pixel for reducing a voltage between a first end and a second end of the light-emitting component.

16 Claims, 11 Drawing Sheets

(52) U.S. Cl.
CPC . *H01L 27/3276* (2013.01); *G09G 2300/0452* (2013.01); *G09G 2320/0233* (2013.01); *G09G 2320/0666* (2013.01)

(56) References Cited

U.S. PATENT DOCUMENTS

2016/0351130 A1* 12/2016 Kikuchi .................. H03M 1/34
2017/0033306 A1*  2/2017 Song .................. H01L 51/5265

FOREIGN PATENT DOCUMENTS

| CN | 106935221 A | 7/2017 |
| CN | 107221289 A | 9/2017 |
| CN | 107871772 A | 4/2018 |

* cited by examiner

DISPLAY PANEL AND DISPLAY DEVICE WITH UNIFORM BRIGHTNESS

CROSS-REFERENCE TO RELATED APPLICATIONS

This application claims priority to a Chinese patent application No. 201810386273.2 filed on Apr. 26, 2018, the disclosure of which is incorporated herein by reference in its entirety.

TECHNICAL FIELD

The present disclosure relates to a technical field of displays and, in particular, to a display panel and a display device.

BACKGROUND

At present, display panels are widely used in electronic devices such as mobile phones, tablet computers, and information query machines in public lobbies. A display panel includes light-emitting components and pixel drive circuits coupled to the light-emitting components. A pixel drive circuit drives a light-emitting component to emit light. The display panel usually achieves a full color display by mixing red, green and blue sub-pixels into any other colors among the light-emitting components.

However, the pixel drive circuits in the existing display panel do not have a reasonable design. In a low gray scale display state, the display panel has poor uniformity, which impacts the display quality and the user experience of the display panel.

SUMMARY

The present disclosure provides a display panel and display device to improve display uniformity of the display panel in a low gray scale display state, and display quality and user experience of the display panel.

In a first aspect, embodiments of the present disclosure provide a display panel. The display panel includes multiple sub-pixels arranged in an array. Each of the sub-pixels includes a pixel drive circuit and a light-emitting component. The pixel drive circuit is configured to provide a driving current for the light-emitting component. The light-emitting component is configured to emit light in response to the driving current.

The sub-pixels include first type sub-pixels and second type sub-pixels. The difference between a starting voltage of the light-emitting component of a first type sub-pixel and a starting voltage of the light-emitting component of a second type sub-pixel is greater than a preset value.

The first type sub-pixel includes a first voltage-regulating module. The first voltage-regulating module is connected between the pixel drive circuit and the light-emitting component of the first type sub-pixel and is configured to increase a voltage between two ends of the light-emitting component. Additionally or alternatively, the second type sub-pixel includes a second voltage-regulating module. The second voltage-regulating module is connected between the pixel drive circuit and a first end of the light-emitting component of the second type sub-pixel and is configured to reduce a voltage between the first end and a second end of the light-emitting component.

In a second aspect, embodiments of the present disclosure provide a display device. The display device includes the display panel of any one of the embodiments of the present disclosure.

In the present disclosure, a first type sub-pixel includes a first voltage-regulating module, which is connected between a pixel drive circuit and a first end of a light-emitting component in the first type sub-pixel and is configured to increase a voltage between the first end and a second end of the light-emitting component; and/or, a second type sub-pixel includes a second voltage-regulating module, which is connected between a pixel drive circuit and a light-emitting component in the second type sub-pixel and is configured to reduce the voltage between the first end and the second end of the light-emitting component, thereby reducing the display difference brought by the difference between the starting voltage of the light-emitting component in the first type sub-pixel and the starting voltage of the light-emitting component in the second type sub-pixel. This achieves an effect that the brightness of the light-emitting components in sub-pixels tends to be consistent in the case where the first type sub-pixel and the second type sub-pixel adopt the same pixel drive circuit and the same driving current, thereby improving the display effect of the display panel in the low gray scale display state, and display quality and user experience of the display panel.

DETAILED DESCRIPTION

The present disclosure will be further described in detail in conjunction with the drawings and embodiments. It is to be understood that the embodiments set forth below are intended to illustrate and not to limit the present disclosure. Additionally, it is to be noted that to facilitate description, only part, not all, of structures related to the present disclosure are illustrated in the drawings.

Figure 1:
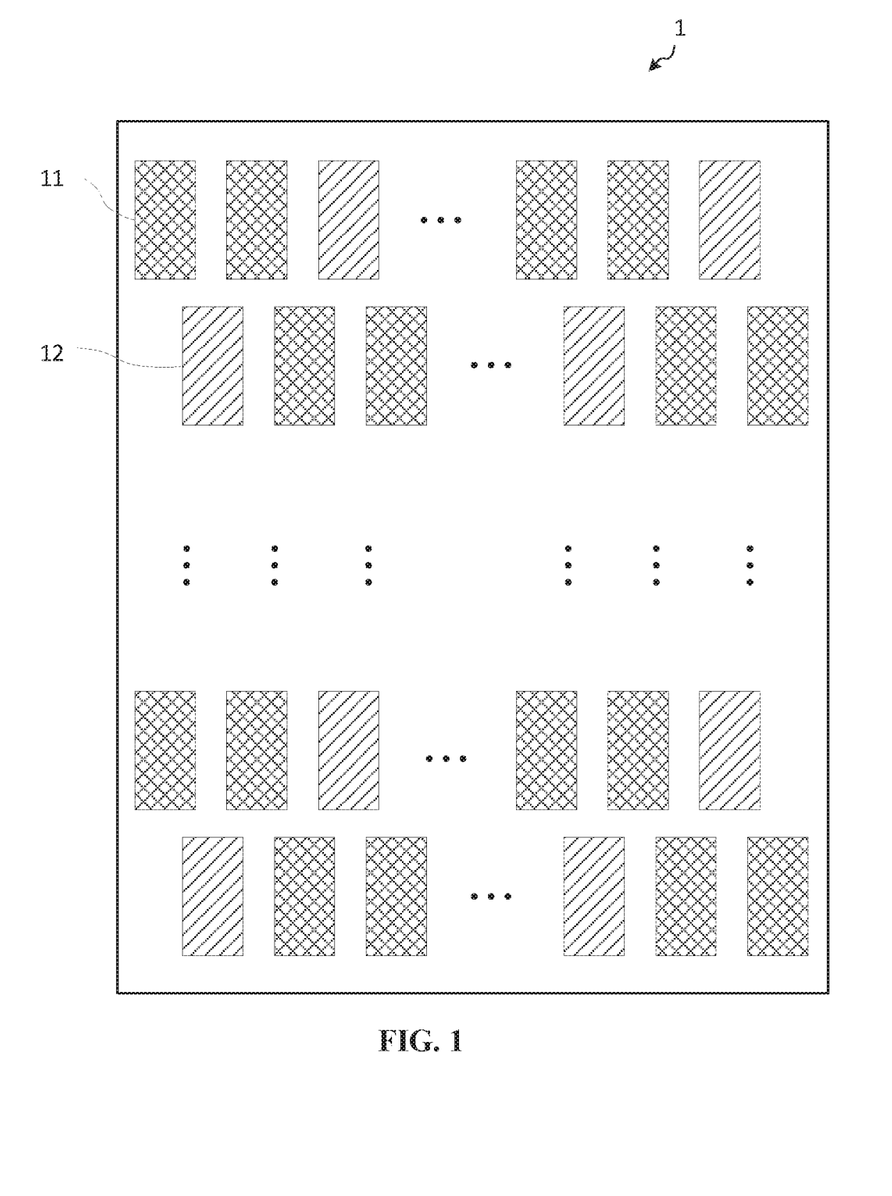
FIG. 1 is a structural diagram of a display panel according to an embodiment of the present disclosure.
Figure 2:
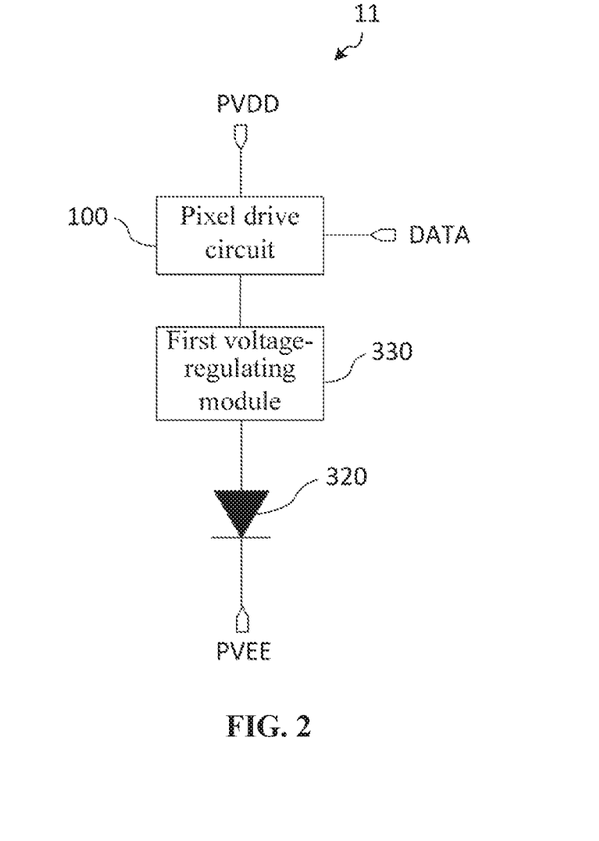
FIG. 2 is a circuit diagram of a first type sub-pixel according to an embodiment of the present disclosure.
Figure 3:
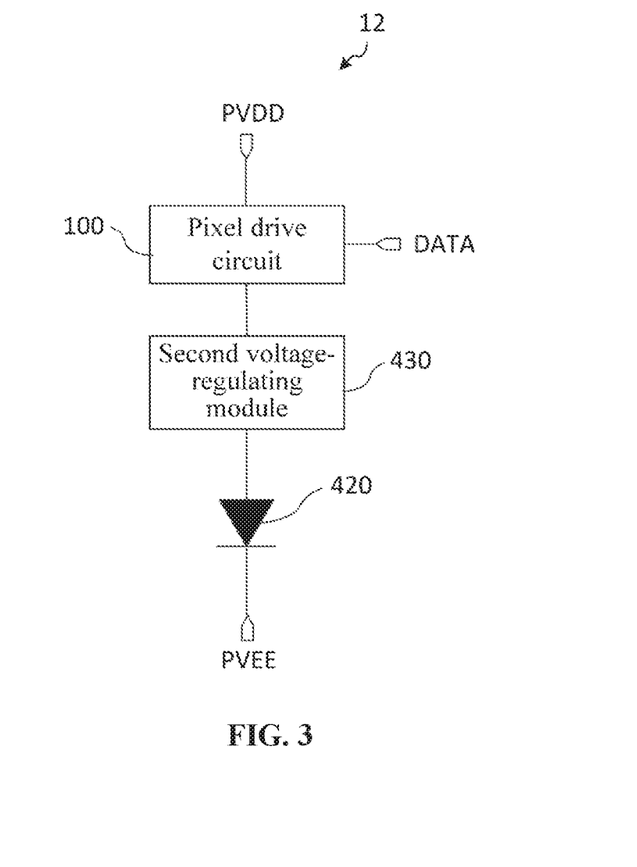
FIG. 3 is a circuit diagram of a second type sub-pixel according to an embodiment of the present disclosure.

FIG. 1 is a structural diagram of a display panel according to an embodiment of the present disclosure. Referring to FIG. 1, the display panel 1 includes multiple sub-pixels arranged in array. Each sub-pixel includes a pixel drive circuit and a light-emitting component. The pixel drive circuit is configured to provide a driving current for the light-emitting component. The light-emitting component is configured to emit light in response to the driving current. The sub-pixels include first type sub-pixels 11 and second type sub-pixels 12 having different starting voltages. The difference between a starting voltage of the light-emitting component of a first type sub-pixel 11 and a starting voltage of the light-emitting component of a second type sub-pixel 12 is greater than a preset value. FIG. 2 is a circuit diagram of a first type sub-pixel according to an embodiment of the present disclosure. FIG. 3 is a circuit diagram of a second type sub-pixel according to an embodiment of the present disclosure. Referring to FIGS. 2 and 3, the first type sub-pixel 11 includes a first voltage-regulating module 330. The first voltage-regulating module 330 is connected between the pixel drive circuit 100 and a first end of the light-emitting component 320 of the first type sub-pixel 11 and is configured to increase a voltage between the first end and a second end of the light-emitting component 320. Additionally or alternatively, the second type sub-pixel 12 includes a second voltage-regulating module 430. The second voltage-regulating module 430 is connected between the pixel drive circuit 100 and a first end of the light-emitting component of the second type sub-pixel 12 and is configured to reduce a voltage between the first end and a second end of the light-emitting component 420. The starting voltage refers to a voltage value required by the light-emitting component of the sub-pixel when the brightness is 0.1 nit.

The present disclosure is described below with reference to an example in which the first type sub-pixel 11 is a blue sub-pixel and the second type sub-pixel 12 is a red sub-pixel or a green sub-pixel. It is to be noted that, in practice, the first type sub-pixel 11 and the second type sub-pixel 12 may have various structures, and are not limited in the present disclosure.

Figure 4:
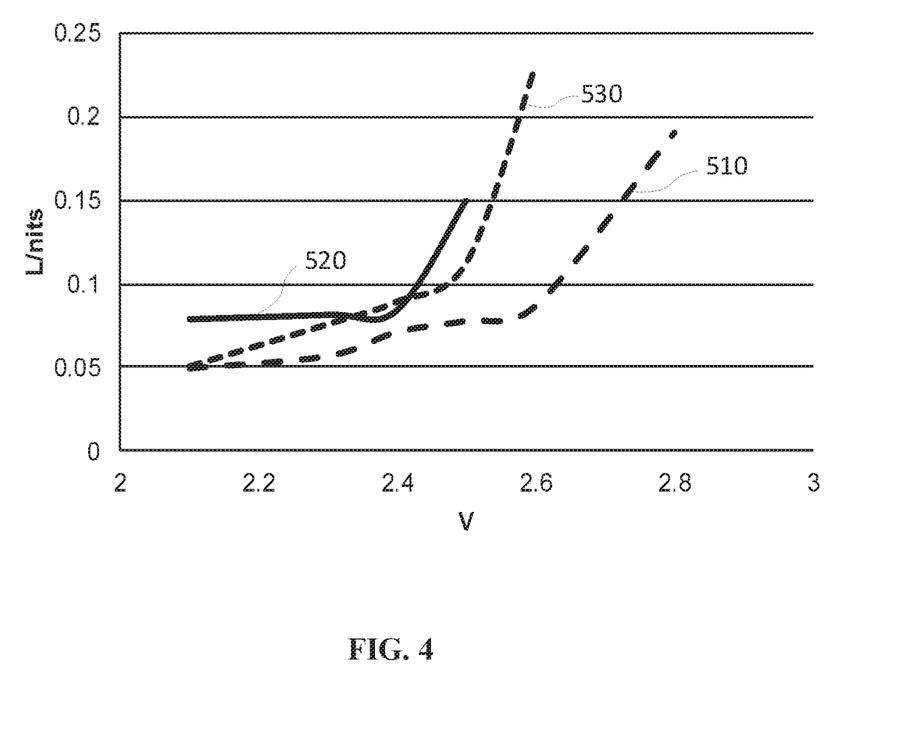
FIG. 4 is a lightness-to-voltage (L-V) curve graph of a light-emitting component of a display panel according to an embodiment of the present disclosure.

FIG. 4 is an L-V curve graph of a light-emitting component of a display panel according to an embodiment of the present disclosure. Referring to FIG. 4, a curve 510 is the L-V curve of the light-emitting component of the blue sub-pixel; a curve 520 is the L-V curve of the light-emitting component of the red sub-pixel; a curve 530 is the L-V curve of the light-emitting component of the green sub-pixel. It can be seen that starting voltages of light-emitting components of the blue sub-pixel, the red sub-pixel and the green sub-pixel are different. The starting voltage of the light-emitting component of the green sub-pixel is close to the starting voltage of the light-emitting component of the red sub-pixel, and is about 2.4V. The starting voltage of the light-emitting component of the blue sub-pixel is higher, and is about 2.6 V. The brightness of the light-emitting component of the sub-pixel relates to not only the driving current passing through the light-emitting component, but also a voltage between two ends of the light-emitting component. Under the condition that the same brightness is generated, the voltage between two ends of the light-emitting component of the blue sub-pixel is higher than the voltage between two ends of the light-emitting components of the red sub-pixel and the green sub-pixel. Therefore, though the same driving current and voltage are provided to the sub-pixels of the display panel 1, the brightness of the light-emitting components of respective sub-pixels is not exactly the same.

However, in most cases, the blue sub-pixel, the red sub-pixel and the green sub-pixel in the existing display panel adopt the same pixel drive circuit 100. Based on the above analysis, the same driving current is provided to respective sub-pixels of the existing display panel, generating different levels of brightness and reducing the display uniformity of the display panel. Especially, in a low gray scale display state, the difference of the display brightness of different sub-pixels has more influence on display color; and the uniformity of display images is poor, impacting the display quality and the user experience of the display panel.

According to the configuration of an embodiment of the present disclosure, the first type sub-pixel 11 includes the first voltage-regulating module 330, the first voltage-regulating module 330 is connected between the pixel drive circuit 100 and a first end of the light-emitting component of the first type sub-pixel 11 and is configured to increase a voltage between the first end and a second end of the light-emitting component; and/or, the second type sub-pixel 12 includes a second voltage-regulating module 430, the second voltage-regulating module 430 is connected between the pixel drive circuit 100 and a first end of the light-emitting component of the second type sub-pixel 12 and is configured to reduce a voltage between the first end and a second end of the light-emitting component, thereby reducing display difference brought by the difference between the starting voltage of the light-emitting component in the first type sub-pixel 11 and the starting voltage of the light-emitting component of the second type sub-pixel 12. Therefore, the embodiment of the present disclosure may enable that the brightness of the light-emitting components in sub-pixels tends to be consistent in the case where the first type sub-pixel 11 and the second type sub-pixel 12 to adopt the same pixel drive circuit 100 and the same driving current, thereby improving the display uniformity of the display panel 1, the display effect of the display panel 1 in the low gray scale display state, and display quality and user experience of the display panel 1.

Figure 5:
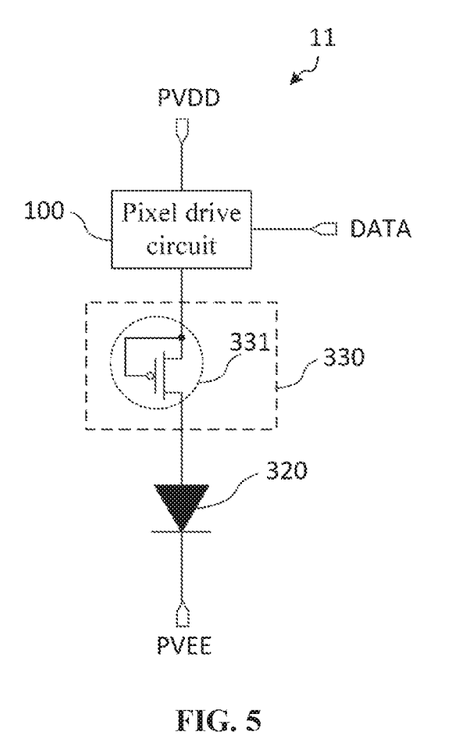
FIG. 5 is a circuit diagram of another first type sub-pixel according to an embodiment of the present disclosure.
Figure 6:
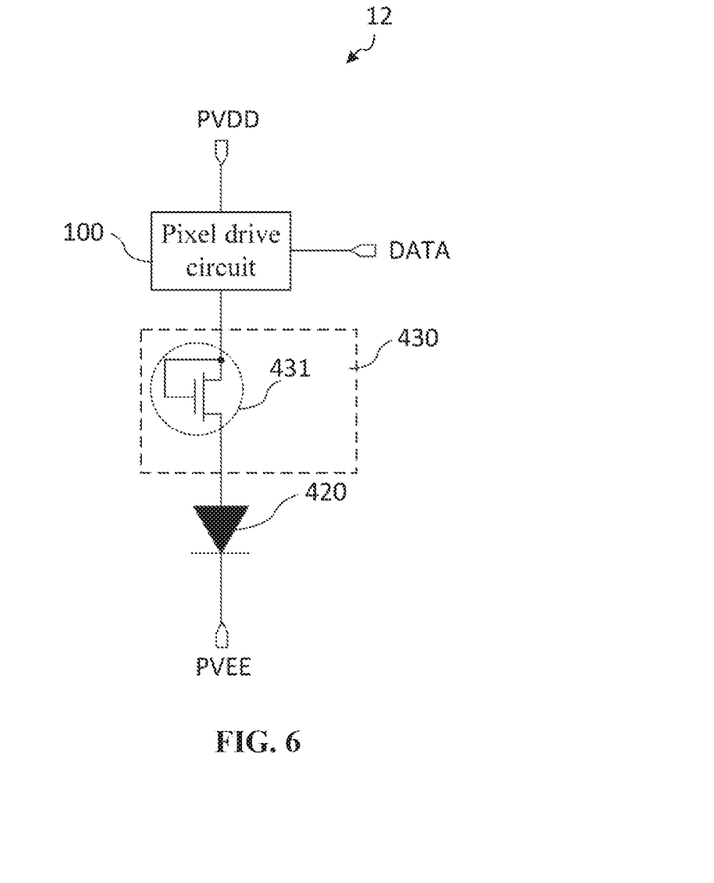
FIG. 6 is a circuit diagram of another second type sub-pixel according to an embodiment of the present disclosure.

On the basis of the above technical solutions, FIG. 5 is a circuit diagram of another first type sub-pixel according to an embodiment of the present disclosure. FIG. 6 is a circuit diagram of another second type sub-pixel according to an embodiment of the present disclosure. Referring to FIG. 5, in the first type sub-pixel 11, the first voltage-regulating module 330 includes a first transistor 331. A first electrode of the first transistor 331 is electrically connected to an output end of the pixel drive circuit 100, and a second electrode of the first transistor 331 is electrically connected to the first end of the light-emitting component 320. The second end of the light-emitting component 320 is electrically connected to a first power supply voltage signal line PVEE. A gate electrode of the first transistor 331 is connected to the first electrode of the first transistor 331. Additionally or alternatively, referring to FIG. 6, in the second type sub-pixel 12, the second voltage-regulating module 430 includes a first transistor 431. A first electrode of the first transistor 431 is electrically connected to an output end of the pixel drive circuit 100, and a second electrode of the first transistor 431 is electrically connected to a first end of the light-emitting component 420. The second end of the light-emitting component 420 is electrically connected to the first power supply voltage signal line PVEE. A gate electrode of the first transistor 431 is connected to the first electrode of the first transistor 431.

According to the configuration of an implementation mode, the first voltage-regulating module 330 and/or the second voltage-regulating module 430 includes the first transistor. The gate electrode of the first transistor is electrically connected to the first electrode of the first transistor. In this way, the first transistor is connected to form a structure of a diode. The diode may increase the voltage between the two ends of the light-emitting component of the first type sub-pixel 11, or reduce the voltage between the two ends of the light-emitting component of the second type sub-pixel 12, which is beneficial for reducing the display difference brought by the difference between the starting voltage of the light-emitting component in the first type sub-pixel 11 and the starting voltage of the light-emitting component in the second type sub-pixel 12, improving the uniformity of display images in the low gray scale display state, and improving the display quality of the display panel 1. In addition, the structure of the first transistor may be the same with other transistors in the display panel 1, and may adopt the same manufacturing process, thereby saving the manufacturing process of the first voltage-regulating module 330 and the second voltage-regulating module 430.

Referring to FIG. 5, the first transistor 331 in the first voltage-regulating module 330 is a P-type transistor. The threshold voltage of the P-type transistor has a negative value. The P-type transistor is disposed between the pixel drive circuit 100 and the light-emitting component 320 of the first type sub-pixel 11, which is equivalent to the increase in the voltage at the first end of the light-emitting component 320 of the first type sub-pixel 11. This is beneficial for reducing the display difference brought by the difference between the starting voltage of the light-emitting component in the first type sub-pixel 11 and the starting voltage of the light-emitting component in the second type sub-pixel 12, thereby improving display uniformity of the display panel 1 in the low gray scale display state, and the display quality of the display panel 1.

Referring to FIG. 6, the first transistor in the second voltage-regulating module 430 is an N-type transistor. The threshold voltage of the N-type transistor has a positive value. The N-type transistor is disposed between the pixel drive circuit 100 and the light-emitting component 420 of the second type sub-pixel 12, which is equivalent to the reduction in the voltage at the first end of the light-emitting component 420 of the second type sub-pixel 12. This is beneficial for reducing the display difference brought by the difference between the starting voltage of the light-emitting component in the first type sub-pixel 11 and the starting voltage of the light-emitting component in the second type sub-pixel 12, thereby improving display uniformity of the display panel 1 in the low gray scale display state, and the display quality of the display panel 1.

On the basis of the above technical solutions, the threshold voltage VD of the first transistor, the starting voltage VB of the light-emitting component of the first type sub-pixel 11 and the starting voltage VRG of the light-emitting component of the second type sub-pixel 12 satisfy a formula: |VB-VRG|>|VB-VRG-VD|.

The threshold voltage VD of the first transistor is configured to satisfy the formula, which actually reduces the difference between the starting voltages of the light-emitting components in the first type sub-pixel 11 and the second type sub-pixel 12, which is beneficial for reducing the display difference brought by the difference between the starting voltages of the light-emitting components in the first type sub-pixel 11 and the second type sub-pixel 12, and improving display uniformity of the display panel 1, thereby improving the display uniformity of the display panel 1 in the low gray scale display state, and the display quality of the display panel 1.

On the basis of the above technical solutions, in an embodiment, the threshold voltage of the first transistor is comprised between 0.2 V and 1.0 V. This further reduces the display difference brought by the difference between the starting voltages of the light-emitting components in the first type sub-pixel 11 and the second type sub-pixel 12, and improves the display quality of the display panel 1.

On the basis of the above technical solutions, in an embodiment, the threshold voltage of the first transistor is 0.3 V. This reduces the display difference brought by the difference between the starting voltages of the light-emitting components in the first type sub-pixel 11 and the second type sub-pixel 12, and improves the display quality of the display panel 1.

Figure 7:
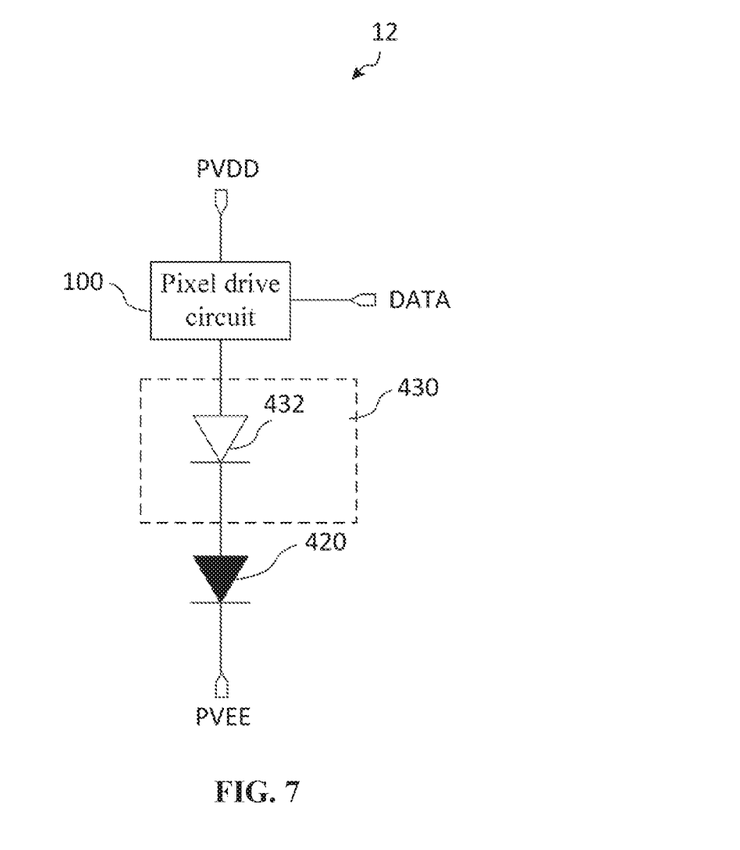
FIG. 7 is a circuit diagram of yet another second type sub-pixel according to an embodiment of the present disclosure.

FIG. 7 is a circuit diagram of yet another second type sub-pixel according to an embodiment of the present disclosure. Referring to FIG. 7, on the basis of the above technical solutions, in an embodiment, the second voltage-regulating module 430 includes a first diode 432. An anode of the first diode 432 is electrically connected to an output end of the pixel drive circuit 100. A cathode of the first diode 432 is electrically connected to the first end of the light-emitting component 420. The second end of the light-emitting component 420 is electrically connected to the first power supply voltage signal line PVEE. The threshold voltage of the first diode 432 has a positive value. The disposeal of the first diode 432 may reduce the voltage of the two ends of the light-emitting component 420 of the second type sub-pixel 12, which is beneficial for reducing the display difference brought by the difference between the starting voltages of the light-emitting components in the first type sub-pixel 11 and the second type sub-pixel 12, thereby improving display uniformity of the display panel 1 in the low gray scale display state, and the display quality of the display panel 1.

Figure 8:
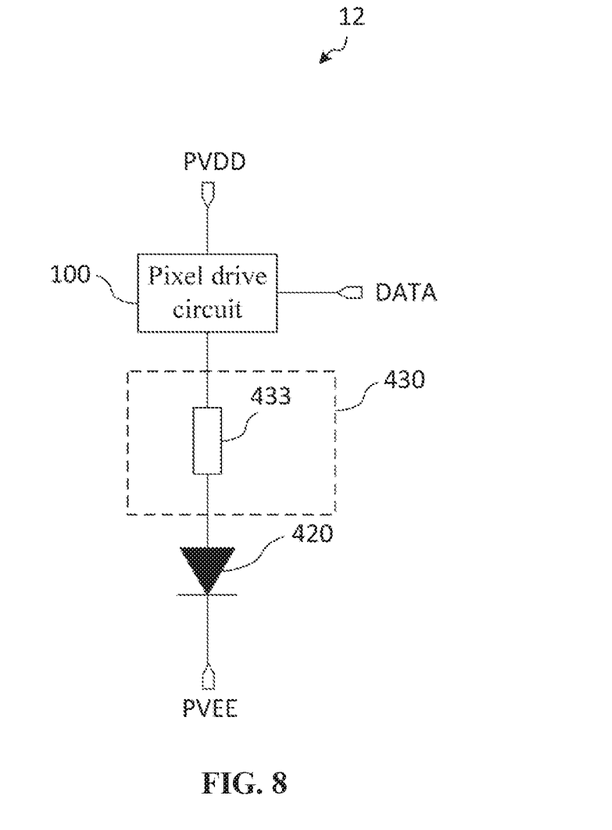
FIG. 8 is a circuit diagram of yet another first type sub-pixel according to an embodiment of the present disclosure.

FIG. 8 is a circuit diagram of yet another first type sub-pixel according to an embodiment of the present disclosure. Referring to FIG. 8, on the basis of the above technical solutions, in an embodiment, the second voltage-regulating module 430 includes a first resistor 433. The first resistor 433 is connected between an output end of the pixel drive circuit 100 and a first end of the light-emitting component 420. A second end of the light-emitting component 420 is electrically connected to the first power supply voltage signal line PVEE. An output voltage of the pixel drive circuit 100 passes through the first resistor 433, and generates a voltage drop between two ends of the first resistor 433 to reduce the voltage between the two ends of the light-emitting component 420 of the second type sub-pixel 12. This is beneficial for reducing the display difference brought by the difference between the starting voltages of the light-emitting components in the first type sub-pixel 11 and the second type sub-pixel 12, thereby improving display uniformity of the display panel 1 in the low gray scale display state, and the display quality of the display panel 1.

On the basis of the above technical solutions, the difference between the starting voltage of the light-emitting component of the first type sub-pixel 11 and the starting voltage of the light-emitting component of the second type sub-pixel 12 is greater than a preset value. The preset value may be greater than or equal to 0.1 V. It can be seen from the foregoing analysis that the greater the difference between the starting voltages of the light-emitting components in the first-type sub-pixel 11 and the second-type sub-pixel 12 is, the worse the display uniformity of the display panel 1 is. Such configuration of the display panel 1, on one hand, may improve the uniformity of the display panel 1, and on the other hand, may reduce manufacturing costs of the display panel 1.

On the basis of the above technical solutions, the first type sub-pixel 11 may include a blue sub-pixel and the second type sub-pixel 12 may include a red sub-pixel and/or a green sub-pixel. It can be seen from the foregoing analysis that the starting voltages of the light-emitting components of the red sub-pixel and the green sub-pixel are low, and the starting voltage of the light-emitting component of the blue sub-pixel is high. Such configuration of the display panel 1 reduces the display difference brought by the difference between the starting voltage of the light-emitting component in the blue sub-pixel and the starting voltage of the light-emitting components in the red sub-pixel and the green sub-pixel, thereby improving the uniformity of the display images in the low gray scale display state, and the display quality of the display panel 1.

Figure 9:
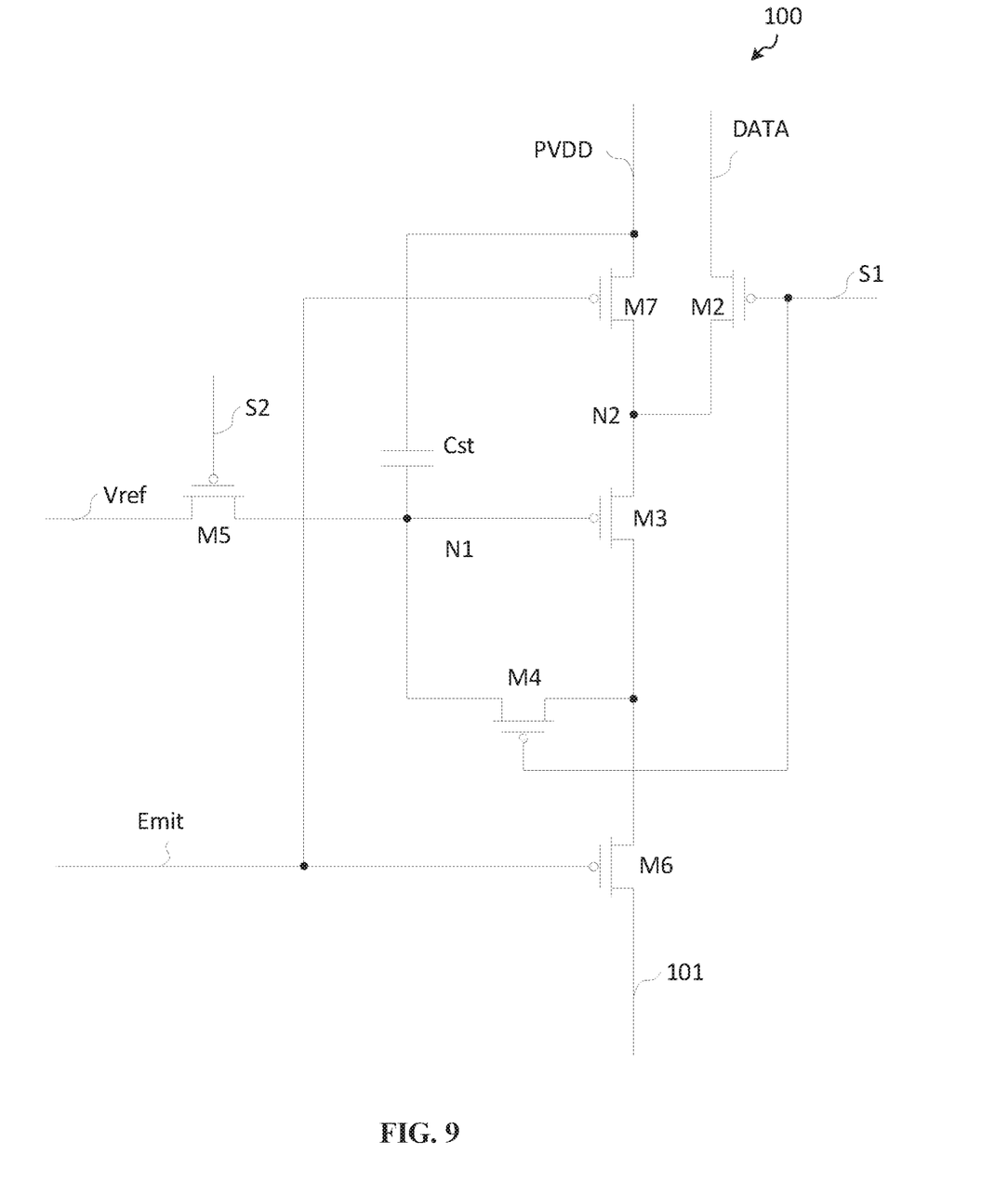
FIG. 9 is a circuit diagram of a pixel drive circuit according to an embodiment of the present disclosure.

FIG. 9 is a circuit diagram of a pixel drive circuit according to an embodiment of the present disclosure. Referring to FIG. 9, on the basis of the above technical solutions, the pixel drive circuit 100 includes a second transistor M2, a third transistor M3, a fourth transistor M4, a fifth transistor M5, a sixth transistor M6, a seventh transistor M7 and a storage capacitor Cst. The second transistor M2 has a first electrode electrically connected to a data line DATA, a second electrode electrically connected to a first electrode of the third transistor M3, and a gate electrode electrically connected to a first scanning line S1. The fourth transistor M4 has a first electrode electrically connected to a second electrode of the third transistor M3, a second electrode electrically connected to the gate electrode of the third transistor M3, and a gate electrode electrically connected to the first scanning line S1. The fifth transistor M5 has a first electrode electrically connected to a second power supply voltage signal line Vref, a second electrode electrically connected to the gate electrode of the third transistor M3, and a gate electrode electrically connected to a second scanning line S2. The sixth transistor M6 has a first electrode electrically connected to the second electrode of the third transistor M3, a second electrode electrically connected to a first end of a voltage-regulating module, and a gate electrode electrically connected to a light-emitting signal line Emit. The voltage-regulating module may be the first voltage-regulating module 330 and/or the second voltage-regulating module 430. The second electrode of the sixth transistor M6 may be the output end 101 of the pixel drive circuit 100. The seventh transistor M7 has a first electrode electrically connected to a third power supply voltage signal line PVDD, a second electrode electrically connected to the first electrode of the third transistor M3, and a gate electrode electrically connected to the light-emitting signal line Emit. A first electrode of the storage capacitor Cst is electrically connected to the gate of the third transistor M3, and a second electrode of the storage capacitor Cst is electrically connected to the first electrode of the third transistor M3.

Figure 10:
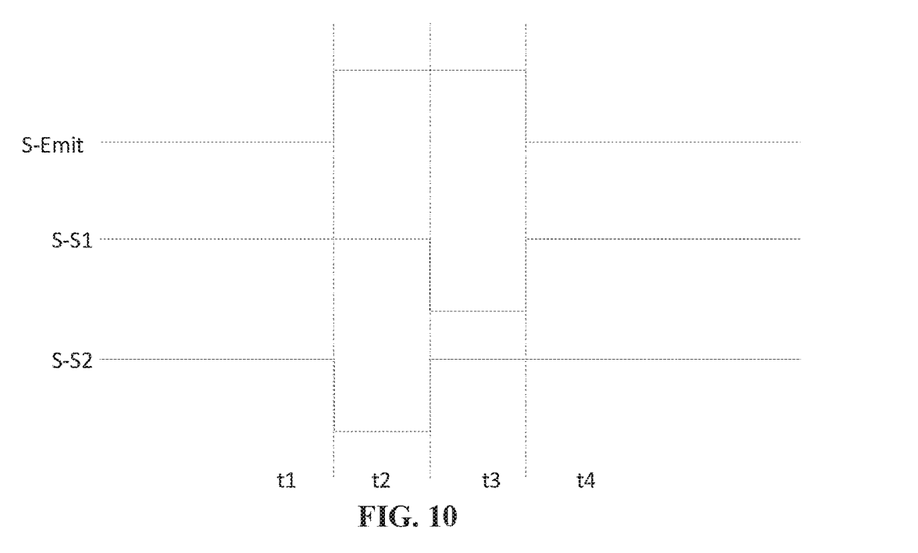
FIG. 10 is a diagram illustrating a driving timing sequence according to an embodiment of the present disclosure.

FIG. 10 is a diagram illustrating a driving timing sequence according to an embodiment of the present disclosure. A working process of the pixel drive circuit 100 provided by the embodiment of the present disclosure is exemplarily described below in conjunction with FIGS. 9 and 10. S-S1 represents a first scanning signal on the first scanning line S1. S-S2 represents a second scanning signal on the second scanning line S2. S-Emit represents a light-emitting signal on the light-emitting signal line Emit. Each transistor is a P-type transistor. A third power supply voltage signal on the third power supply voltage signal line PVDD is high-level. A first power supply voltage signal on the first power supply voltage signal line PVEE is low-level. The working process of the pixel drive circuit 100 includes stages described below.

In stage t1, the light-emitting signal S-Emit is low-level. The sixth transistor M6 and the seventh transistor M7 are turned on. When a last stage is finished, the gate electrode of the third transistor M3 is high-level and the third transistor M3 is turned off. Since the seventh transistor M7 is turned on, the third power supply voltage signal on the third power supply voltage signal line PVDD is written into the first electrode of the third transistor M3, that is, the source electrode of the third transistor M3. This stage is also called a turned-off stage.

In stage t2, the light-emitting signal Emit is high-level. The sixth transistor M6 and the seventh transistor M7 are turned off. The second scanning signal S-S2 is low-level. The fifth transistor M5 is turned on. A second power supply voltage signal on the second power supply voltage signal line Vref is written into the gate electrode of the third transistor M3 and the first electrode of the storage capacitor Cst. At this stage, the second power supply voltage signal on the second power supply voltage signal line Vref may be a low-level signal in order to reset the voltage at the gate electrode of the third transistor M3 and the voltage at the first electrode of the storage capacitor Cst. This ensures that in a next stage, the third transistor M3 is turned on and a data signal may be written into the gate electrode of the third transistor M3. This stage is also called a reset stage.

In stage t3, the light-emitting signal Emit is high-level. The sixth transistor M6 and the seventh transistor M7 are turned off. The second scanning signal S-S2 is high-level. The fifth transistor M5 is turned off. The first scanning signal S-S1 is low-level. The second transistor M2 and the fourth transistor M4 are turned on. The data signal on the data line DATA passes through the second transistor M2, the third transistor M3 and the fourth transistor M4 sequentially and is written into the gate electrode of the third transistor M3 and the first electrode of the storage capacitor Cst. The voltage at the gate electrode of the third transistor M3 is gradually increasing until a difference between the voltage at the gate electrode and the voltage at the source electrode of the third transistor M3 is equal to a threshold voltage of the third transistor M3. At this time, the third transistor M3 is turned off. The voltage at the gate electrode of the third transistor M3 stays unchanged. The voltage at the gate electrode of the third transistor M3, that is, a voltage at a first node N1 satisfies $V_1=V_{data}+V_{th}$, where $V_{data}$ is a voltage value of the data signal on the data line, $V_{th}$ is the threshold voltage of the third transistor M3.

In stage t4, which is also called a light-emitting stage, the light-emitting signal Emit is low-level. The sixth transistor M6 and the seventh transistor M7 are turned on. The first scanning signal S-S1 is high-level. The second transistor M2 and the fourth transistor M4 are turned off. The third transistor M3 and the fifth transistor M5 are also turned off. A leakage current of the third transistor M3, that is, a driving current generated by the third transistor M3 drives a light-emitting component 11 to emit light. The driving current $I_d$ satisfies the following formula:

$$I_d = \frac{1}{2}\mu C_{ox}\frac{W}{L}(V_{gs} - V_{th})^2 =$$
$$\frac{1}{2}\mu C_{ox}\frac{W}{L}(V_1 - V_{PVDD} - V_{th})^2 = I_d = \frac{1}{2}\mu C_{ox}\frac{W}{L}(V_{gs} - V_{th})^2 = \frac{1}{2}\mu C_{ox}\frac{W}{L}$$
$$(V_{data} + V_{th} - V_{PVDD} - V_{th})^2 = \frac{1}{2}\mu C_{ox}\frac{W}{L}(V_{data} - V_{PVDD})^2$$

$V_{PVDD}$ is a voltage value of the third power supply voltage on the third power supply voltage signal line PVDD, that is, a voltage value at a second node N2. It can be seen that the driving current $I_d$ generated by the third transistor M3 is irrelevant to the threshold voltage $V_{th}$ of the third transistor M3. The display quality of the display panel 1 is further improved.

In the embodiment of the present disclosure, the second transistor M2, the third transistor M3, the fourth transistor M4, the fifth transistor M5, the sixth transistor M6 and the seventh transistor M7 may all be P-type transistors. In other implementation modes of the embodiment of the present disclosure, the second transistor M2, the third transistor M3, the fourth transistor M4, the fifth transistor M5, the sixth transistor M6 and the seventh transistor M7 may all be N-type transistors. In a case where the driving transistor is an N-type transistor, a voltage difference between a voltage at the gate electrode and a voltage at the source electrode of the driving transistor is required to be less than a negative value of a threshold voltage of the driving transistor.

On the basis of the above technical solutions, in an embodiment, a difference between a voltage on the third power supply voltage signal line PVDD and a voltage on the first power supply voltage signal line PVEE is greater than or equal to 9 V. Research shows that the greater the difference between the voltage on the third power supply voltage signal line PVDD and the voltage on the first power supply voltage signal line PVEE is, the smaller the difference of the display brightness of sub-pixels is. A cross-voltage between the third power supply voltage signal line PVDD and the first power supply voltage signal line PVEE is configured to be greater than or equal to 9 V, further improving the display uniformity of the display panel 1.

Figure 11:
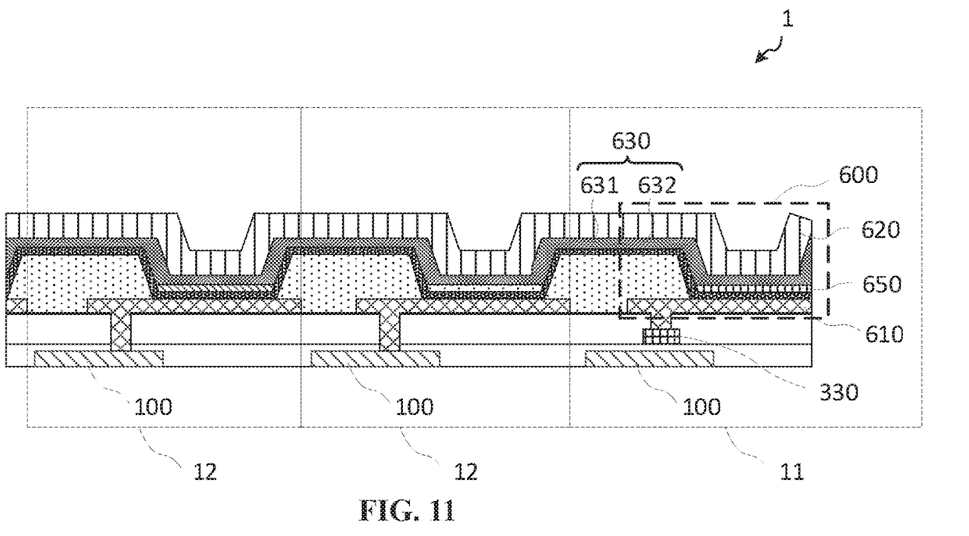
FIG. 11 is a structural diagram of another display panel according to an embodiment of the present disclosure.

FIG. 11 is a structural diagram of another display panel according to an embodiment of the present disclosure. Referring to FIG. 11, on the basis of the above technical solutions, the display panel 1 is an organic light-emitting diode display panel to improve the display uniformity and display effect of the organic light-emitting diode display panel.

In the above technical solutions, the first type sub-pixel 11 and the second type sub-pixel 12 each includes a light-emitting component 600. The light-emitting components 600 of the first type sub-pixel 11 and the second type sub-pixel 12 have a same structure and have multiple structural forms. Detailed examples are given below, but not intended to limit the present disclosure.

Referring to FIG. 11, a light-emitting component includes a first electrode 610, a second electrode 620, a light-emitting layer 650 and at least one first common layer 630. The second electrode 620 and the first electrode 610 are disposed opposite to each other. The light-emitting layer 650 is disposed between the first electrode 610 and the second electrode 620. The at least one first common layer 630 is disposed between the first electrode 610 and the light-emitting layer 650. Multiple light-emitting components 600 share the first common layer 630, and the first electrode 610 is a first end of the light-emitting component 600. Because the difference between a starting voltage of the light-emitting components 600 in the first type sub-pixels 11 and a starting voltage of the light-emitting components 600 in the second type sub-pixels 12 is greater than a preset value, when the first type sub-pixels 11 emit light to display a single color image, electrons and holes in the first common layer 630 form a horizontal leakage current, which makes the light-emitting components 600 in the light-emitting components 600 to emit light accidentally, causing an inference phenomenon of the display color of the display panel 1 and a distorted display image. In the embodiment of the present disclosure, on one hand, under the driving of the same driving current, the brightness of the light-emitting components 600 of the sub-pixels tend to be consistent, improving the display uniformity of the display panel; on the other hand, the horizontal leakage current of the first common layer 630 in the first type sub-pixel 11 and second type sub-pixel 12 is reduced, further improving the display effect of the display panel 1 in the low gray scale display state and the user experience of the display panel 1.

If the first electrode 610 is an anode, the first common layer 630 may be one or more of a hole injection layer, a hole transport layer and an electron blocking layer. If the first electrode 610 is a cathode, the first common layer 630 may be one or more of an electron injection layer, an electron transport layer and a hole blocking layer. This improves mobility of carriers of the light-emitting component 600 and reduces the power consumption of the device.

It is to be noted that specific structures of the voltage-regulating module in the above embodiments may be various. Exemplarily, referring to FIG. 11, a film layer containing the first voltage-regulating module 330 and/or the second voltage-regulating module 430 is disposed between the pixel drive circuit 100 and the light-emitting component 600. In other implementation modes, the first voltage-regulating module 330 and the second voltage-regulating module 430 may also be disposed at the same film layer with the transistors of the pixel drive circuit 100, which is beneficial for reducing the thickness of the display panel 1, the number of masks and the manufacturing costs of the display panel 1.

Figure 12:
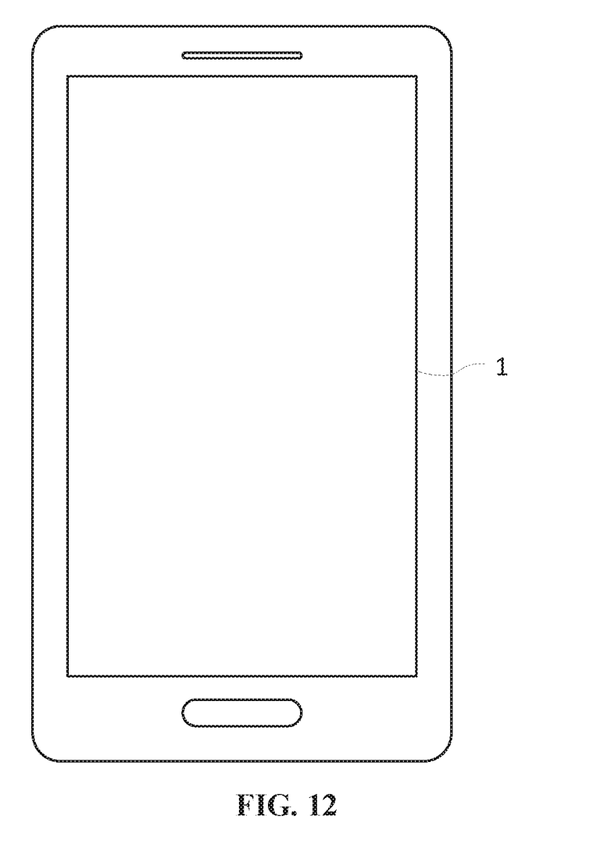
FIG. 12 is a structural diagram of a display device according to an embodiment of the present disclosure.

An embodiment of the present disclosure further provides a display device. FIG. 12 is a structural diagram of the display device according to the embodiment of the present disclosure. Referring to FIG. 12, the display device includes the display panel of any one of embodiments of the present disclosure.

According to the configuration of the display device provided by the present disclosure, a first type sub-pixel includes a first voltage-regulating module, the first voltage regulating module is connected between a pixel drive circuit and a first end of a light-emitting component in the first type sub-pixel and is configured to increase a voltage between the first end and a second end of the light-emitting component; additionally or alternatively, a second type sub-pixel includes a second voltage-regulating module, the second voltage-regulating module is connected between a pixel drive circuit and a first end of a light-emitting component in the second type sub-pixel and is configured to reduce the voltage between the first end and the second end of the light-emitting component, thereby reducing the display difference brought by the difference between starting voltages of the light-emitting components in the first type sub-pixel and the second type sub-pixel. This achieves an effect that the brightness of the light-emitting components in sub-pixels tends to be consistent in the case where the first type sub-pixel and the second type sub-pixel adopt the same pixel drive circuit and the same driving current, thereby improving display uniformity of the display device, the display effect of the display device in the low gray scale display state, and display quality and user experience of the display device.

It is to be noted that the above are only preferred embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising a plurality of sub-pixels arranged in array, the plurality of sub-pixels each comprises a pixel drive circuit and a light-emitting component; the pixel drive circuit is configured to provide a driving current for the light-emitting component, and the light-emitting component is configured to emit light in response to the driving current;

the plurality of sub-pixels comprise a plurality of first type sub-pixels and a plurality of second type sub-pixels, a difference between a turn-on voltage of the light-emitting component of each first type sub-pixel of the plurality of first type sub-pixels and a turn-on voltage of the light-emitting component of each second type sub-pixel of the plurality of second type sub-pixels is greater than a preset value;

wherein the plurality of sub-pixels comprises at least one of a plurality of first voltage-regulating modules or a plurality of second voltage-regulating modules, wherein the plurality of first voltage-regulating modules are comprised in the plurality of first type sub-pixels, each first voltage-regulating module of the plurality of first voltage-regulating modules is connected between the pixel drive circuit and a first end of the light-emitting component of the each first type sub-pixel and is configured to increase a voltage between the first end and a second end of the light-emitting component of the each first type sub-pixel;

wherein the plurality of second voltage-regulating modules are comprised in the plurality of second type sub-pixels, each second voltage-regulating module of the plurality of second voltage-regulating modules is connected between the pixel drive circuit and a first end of the light-emitting component of the each second type sub-pixel and is configured to reduce a voltage between the first end and a second end of the light-emitting component of the each second type sub-pixel, wherein the first end and the second end of the light-emitting component are an anode and a cathode respectively.

2. The display panel according to claim 1, wherein at least one of the each first voltage-regulating module or the each second voltage-regulating module comprises a first transistor, a first electrode of the first transistor is electrically connected to an output end of the pixel drive circuit, and a second electrode of the first transistor is electrically connected to the first end of the light-emitting component; the second end of the light-emitting component is electrically connected to a first power supply voltage signal line; and a gate electrode of the first transistor is electrically connected to the first electrode of the first transistor.

3. The display panel according to claim 2, wherein the first transistor of the each first voltage-regulating module is a P-type transistor.

4. The display panel according to claim 2, wherein the first transistor of the each second voltage-regulating module is an N-type transistor.

5. The display panel according to claim 2, wherein a threshold voltage VD of the first transistor, the turn-on voltage VB of the light-emitting component of the each first type sub-pixel and the turn-on voltage VRG of the light-emitting component of the each second type sub-pixel satisfy a formula: |VB-VRG|>|VB-VRG-VD|.

6. The display panel according to claim 5, wherein the threshold voltage of the first transistor has a value comprised in a range of 0.2 V to 1.0 V.

7. The display panel according to claim 2, wherein the pixel drive circuit comprises a second transistor, a third transistor, a fourth transistor, a fifth transistor, a sixth transistor, a seventh transistor and a storage capacitor;

the second transistor comprises a first electrode electrically connected to a data line, a second electrode electrically connected to a first electrode of the third transistor, and a gate electrically connected to a first scanning line;

the fourth transistor comprises a first electrode electrically connected to a second electrode of the third transistor, a second electrode electrically connected to a gate electrode of the third transistor, and a gate electrode electrically connected to the first scanning line;

the fifth transistor comprises a first electrode electrically connected to a second power supply voltage signal line, a second electrode electrically connected to the gate electrode of the third transistor, and a gate electrode electrically connected to a second scanning line;

the sixth transistor comprises a first electrode electrically connected to the second electrode of the third transistor, a second electrode electrically connected to a first end of the at least one of the first voltage-regulating module or the second voltage-regulating module, and a gate electrode electrically connected to a light-emitting signal line;

the seventh transistor comprises a first electrode electrically connected to a third power supply voltage signal line, a second electrode electrically connected to the first electrode of the third transistor, and a gate electrode electrically connected to the light-emitting signal line;

the storage capacitor comprises a first electrode electrically connected to the gate electrode of the third transistor, and a second electrode electrically connected to the first electrode of the third transistor.

8. The display panel according to claim 7, wherein the second transistor, the third transistor, the fourth transistor, the fifth transistor, the sixth transistor and seventh transistor are all P-type transistors.

9. The display panel according to claim 7, wherein a difference between a voltage of the third power supply voltage signal line and a voltage of the first power supply voltage signal line is greater than or equal to 9 V.

10. The display panel according to claim 1, wherein the each second voltage-regulating module comprises a first diode, an anode of the first diode is electrically connected to an output end of the pixel drive circuit, a cathode of the first diode is electrically connected to the first end of the light-emitting component of the each first type sub-pixel; and the second end of the light-emitting component of the each first type sub-pixel is electrically connected to a first power supply voltage signal line.

11. The display panel according to claim 1, wherein the each second voltage-regulating module comprises a first resistor, the first resistor is connected between an output end of the pixel drive circuit and a first end of the light-emitting component of the each second type sub-pixel; and a second end of the light-emitting component of the each second type sub-pixel is electrically connected to a first power supply voltage signal line.

12. The display panel according to claim 1, wherein the preset value is greater than or equal to 0.1 V.

13. The display panel according to claim 1, wherein the plurality of first type sub-pixels comprises a plurality of blue sub-pixels and the plurality of second type sub-pixels comprises at least one of a plurality of red sub-pixels or a plurality of green sub-pixels.

14. The display panel according to claim 1, wherein the display panel is an organic light-emitting diode display panel.

15. The display panel of claim 14, wherein the light-emitting component comprises:
 a first electrode;
 a second electrode disposed opposite to the first electrode;
 a light-emitting layer disposed between the first electrode and the second electrode; and
 at least one first common layer disposed between the first electrode and the light-emitting layer; wherein a plurality of the light-emitting components share the at least one first common layer; and
 the first electrode is the first end of the light-emitting component.

16. A display device, comprising a display panel, wherein the display panel comprises:
 a plurality of sub-pixels arranged in array, the plurality of sub-pixels each comprises a pixel drive circuit and a light-emitting component; the pixel drive circuit is configured to provide a driving current for the light-emitting component, and the light-emitting component is configured to emit light in response to the driving current;
 the plurality of sub-pixels comprise a plurality of first type sub-pixels and a plurality of second type sub-pixels, a difference between a turn-on voltage of the light-emitting component of each first type sub-pixel of the plurality of first type sub-pixels and a turn-on voltage of the light-emitting component of each second type sub-pixel of the plurality of second type sub-pixels is greater than a preset value;
 wherein the plurality of sub-pixels comprises at least one of a plurality of first voltage-regulating modules or a plurality of second voltage-regulating modules,
 wherein the plurality of first voltage-regulating modules are comprised in the plurality of first type sub-pixels, each first voltage-regulating module of the plurality of first voltage-regulating modules is connected between the pixel drive circuit and a first end of the light-emitting component of the each first type sub-pixel and is configured to increase a voltage between the first end and a second end of the light-emitting component of the each first type sub-pixel;
 wherein the plurality of second voltage-regulating modules are comprised in the plurality of second type sub-pixels, each second voltage-regulating module of the plurality of second voltage-regulating modules is connected between the pixel drive circuit and a first end of the light-emitting component of the each second type sub-pixel and is configured to reduce a voltage between the first end and a second end of the light-emitting component of the each second type sub-pixel,
 wherein the first end and the second end of the light-emitting component are an anode and a cathode respectively.

* * * * *